United States Patent

Saitou et al.

[11] Patent Number: 5,999,058
[45] Date of Patent: Dec. 7, 1999

[54] MICROWAVE AMPLIFIER

[75] Inventors: Shigeru Saitou; Shuichirou Agu, both of Tokyo, Japan

[73] Assignee: NEC Corporation, Tokyo, Japan

[21] Appl. No.: 09/027,677

[22] Filed: Feb. 23, 1998

[30] Foreign Application Priority Data

Feb. 21, 1997 [JP] Japan ................................. 9-037484

[51] Int. Cl.[6] .................................................. H03F 3/60
[52] U.S. Cl. ......................... 330/286; 330/302; 333/176
[58] Field of Search ................................ 330/286, 295, 330/302, 306, 307; 333/204, 176, 219, 218

[56] References Cited

U.S. PATENT DOCUMENTS

| | | | |
|---|---|---|---|
| 4,591,803 | 5/1986 | Saleh ........................................ | 303/286 |
| 4,803,443 | 2/1989 | Takagi et al. ............................ | 330/286 |
| 4,994,761 | 2/1991 | Craft ......................................... | 330/302 |
| 5,272,450 | 12/1993 | Wisherd ................................... | 330/297 |
| 5,274,341 | 12/1993 | Sekine et al. ............................ | 330/295 |
| 5,276,406 | 1/1994 | Samay et al. ............................ | 330/302 |
| 5,329,249 | 7/1994 | Cripps ...................................... | 330/302 |
| 5,357,213 | 10/1994 | Michel et al. ............................ | 330/286 |
| 5,412,347 | 5/1995 | Minnis ...................................... | 330/286 |
| 5,592,122 | 1/1997 | Masahiro et al. ........................ | 330/286 |
| 5,745,857 | 4/1998 | Maeng et al. ............................ | 455/553 |
| 5,812,221 | 9/1998 | Davis et al. .............................. | 348/723 |

FOREIGN PATENT DOCUMENTS

| | | | |
|---|---|---|---|
| 256202 | 12/1985 | Japan ..................................... | 330/286 |
| 61-35006 | 2/1986 | Japan . | |
| 284006 | 11/1989 | Japan ..................................... | 330/286 |
| 404129308 | 4/1992 | Japan ..................................... | 330/286 |
| 406188654 | 7/1994 | Japan ..................................... | 330/286 |
| 408293746 | 11/1996 | Japan . | |

Primary Examiner—Benny Lee
Assistant Examiner—Khanh Van Nguyen
Attorney, Agent, or Firm—Sughrue, Mion, Zinn, Macpeak & Seas, PLLC

[57] ABSTRACT

A microwave amplifier includes an FET, a DC bias voltage supply circuit, and a beat smoothing circuit. The FET amplifies a microwave signal including a plurality of carrier frequencies that are different from each other. The DC bias voltage supply circuit supplies a DC bias voltage to the FET. The beat smoothing circuit removes a beat frequency generated on a line connected to the FET due to a difference among the plurality of carrier frequencies. The beat smoothing circuit is constituted by a microstrip line having a low impedance with respect to the beat frequency, and a capacitor for short-circuiting to ground the beat frequency output from the filter means.

27 Claims, 12 Drawing Sheets

MICROWAVE AMPLIFIER

BACKGROUND OF THE INVENTION

The present invention relates to a microwave amplifier and, more particularly, to a microwave amplifier for amplifying a microwave signal including a plurality of different carrier frequencies.

In general, in a satellite communication system and the like, communication is performed by using a microwave (ultra-high frequency wave) modulated by an input signal having a comparatively low frequency. The transmitter of such a communication system employs a microwave amplifier using an active element, e.g., an FET (Field Effect Transistor), in order to amplify the microwave signal with a high gain.

Conventional, in such a microwave amplifier, a DC bias voltage is supplied through a $\lambda g/4$ line (where $\lambda g$ is the wavelength on the microstrip line), having a high impedance with respect to the carrier frequency of the microwave signal, as a means for supplying an appropriate DC bias voltage to the active element.

Figure 9A:
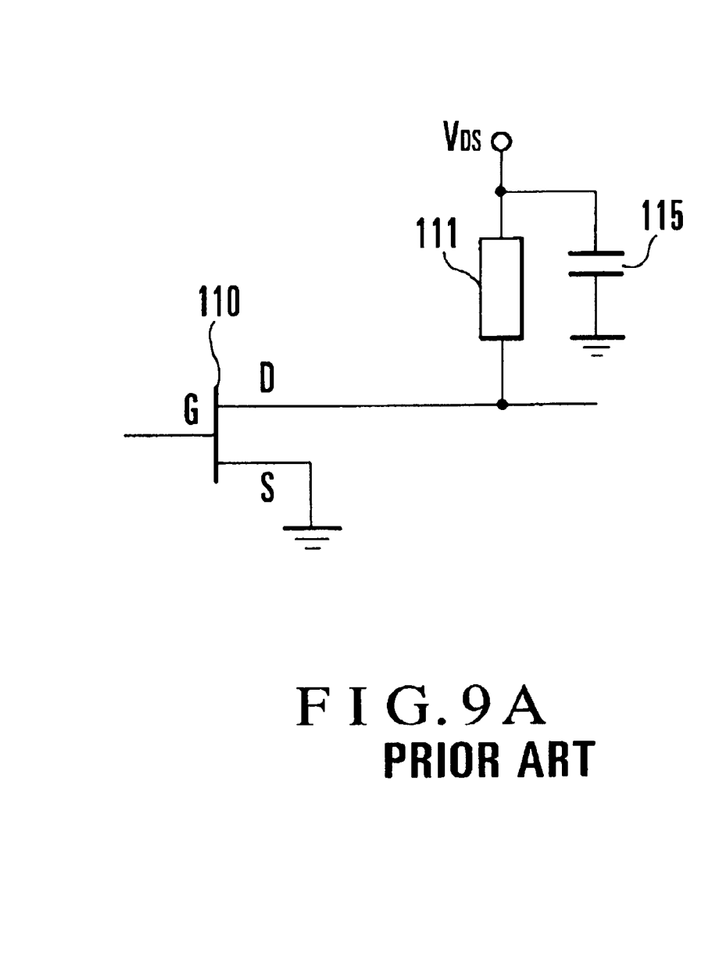
Figure 9B:
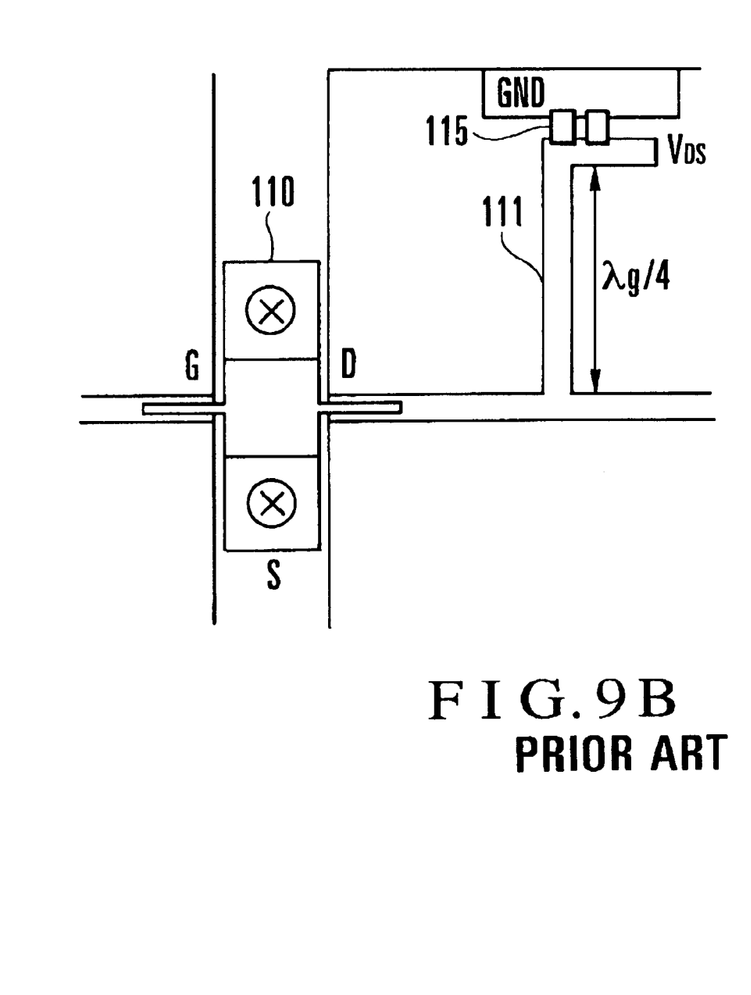

FIGS. 9A and 9B show the circuit diagram and the mounted state, respectively, of the main part of a conventional microwave amplifier. Referring to FIG. 9A, one end of a $\lambda g/4$ line 111 is connected to a drain D of an FET 110 a source S of which is grounded. The other end of the $\lambda g/4$ line 111 is connected to a DC bias voltage $V_{DS}$ and grounded through a capacitor 115 that short-circuits an input signal. These elements are mounted with the layout shown in FIG. 9B.

While a high impedance is maintained with respect to the carrier frequency and the input signal frequency is short-circuited by a DC bias voltage supply circuit constituted by the $\lambda g/4$ line 111 and capacitor 115, the DC bias voltage $V_{DS}$ is supplied to the drain D of the FET 110. This circuit arrangement is described in, e.g., Japanese Patent Laid-Open No. 61-35006.

In this conventional microwave amplifier, since a pure resistance component R of the $\lambda g/4$ line 111 for supplying the DC bias voltage $V_{DS}$ is very low, the voltage drop caused by the pure resistance component R can be decreased. However, a reactance component jX of the $\lambda g/4$ line 111 is not considered. Accordingly, the low-frequency beat signal generated in the presence of a large number of carrier frequencies as the carrier frequencies of the microwave signal decreases the DC bias voltage $V_{DS}$ with the reactance component jX of the DC bias voltage supply circuit in this beat frequency band.

For example, when two carrier signals having different carrier frequencies f1 and f2 (f1<f2) are mixed, a beat signal having as its frequency the frequency difference f2−f1 of these two frequencies is generated. As a result, the DC bias current supplied to the drain D of the FET 110 also changes in accordance with the beat signal.

The $\lambda g/4$ line 111 through which the DC bias current flows has an impedance of R+jX. The drain voltage $V_{DS}(t)$ of the FET 10 is represented by:

$$V_{DS}(t)=V_{DS}-I_D(t)\cdot(R+jX)$$

where $I_D(t)$ is the current of the frequency component of the signal.

When the beat signal described above is generated, the drain voltage $V_{DS}(t)$ of the FET 110 is fluctuated by the current $I_D(t)$ of the frequency component, the pure resistance component R, and the reactance component jX. It has become apparent that this interferes with the bias voltage to fluctuate the DC bias voltage of the drain D, thereby causing distortion in the amplified output. In other words, the present inventors have found that the beat signal is the cause of distortion in the output.

SUMMARY OF THE INVENTION

It is an object of the present invention to provide a microwave amplifier in which a beat signal is decreased to provide better distortion characteristics.

In order to achieve the above object, according to the present invention, there is provided a microwave amplifier comprising an active element for amplifying a microwave signal including a plurality of carrier frequencies that are different from each other, DC bias voltage supply means for supplying a DC bias voltage to the active element, and beat removing means for removing a beat frequency generated on a line connected to the active element due to a difference among the plurality of carrier frequencies, the beat removing means being constituted by filter means having a low impedance with respect to the beat frequency, and short-circuiting means for short-circuiting to gr d the beat frequency output from the filter means.

BRIEF DESCRIPTION OF THE DRAWINGS

FIGS. 6A and 6B are circuit diagrams of the main part of microwave amplifiers according to the fifth embodiment of the present invention, in which FIG. 6A shows a case wherein beat smoothing circuits are connected to both gates G and drains D of FETs, and FIG. 6B shows a case wherein beat smoothing circuits are connected to only drains D of FETs;

FIGS. 9A and 8B are plan view s showing the circuit diagram and the mounted state, respectively, of the main part of a conventional microwave amplifier;

DESCRIPTION OF THE PREFERRED EMBODIMENTS

The present invention will be described in detail with reference to the accompanying drawings.

Figure 1A:
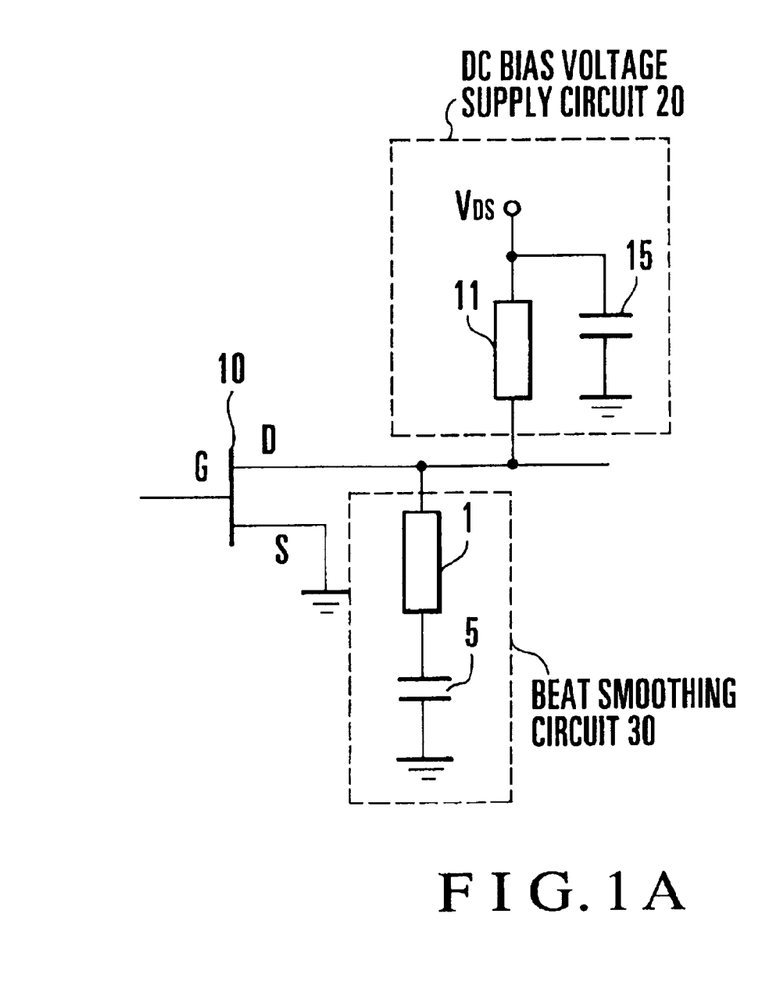
FIGS. 1A and 1B are plan views showing the circuit diagram and the mounted state, respectively, of the main part of a microwave amplifier according to the first embodiment of the present invention.
Figure 1B:
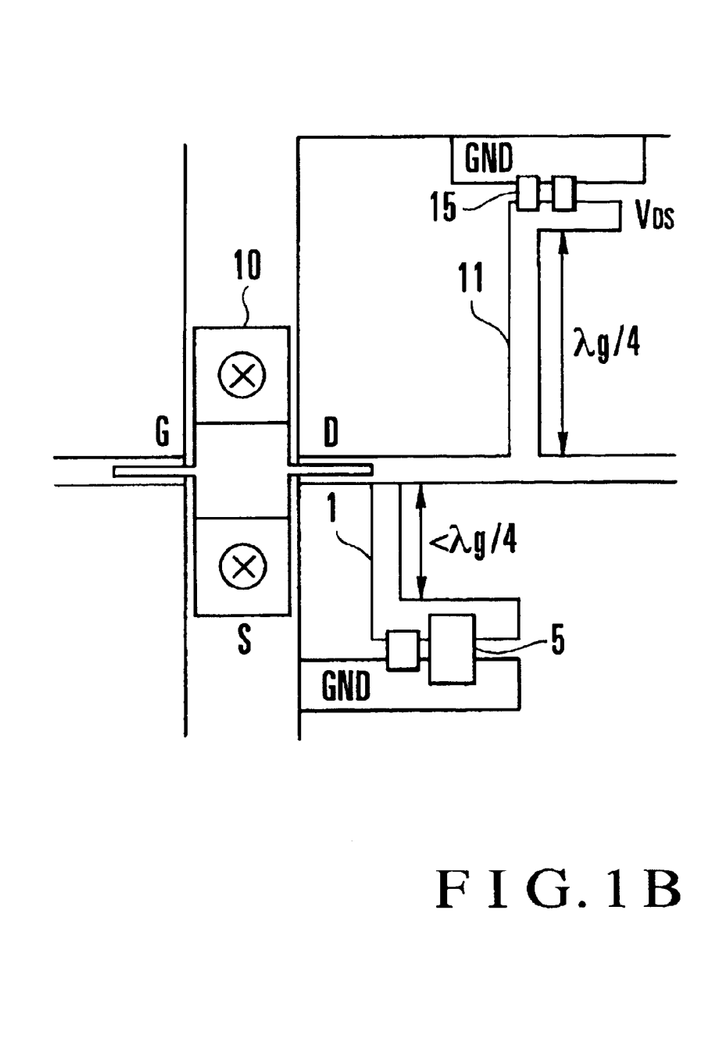

FIGS. 1A and 1B show the main part of a microwave amplifier according to the first embodiment of the present invention. Referring to FIG. 1A, one end of a λg/4 line 11 for blocking runaround of the carrier frequency is connected to a drain D (output terminal) of an FET 10 a source S of which is grounded. The other end of the λg/4 line 11 is connected to a DC bias voltage $V_{DS}$ and is grounded through a capacitor 15 that short-circuits an input signal. The capacitor 15 short-circuits noise components other than the carrier frequency and a carrier frequency component which has leaked without being blocked by the λg/4 line 11. The λg/4 line 11 and the capacitor 15 constitute a DC bias voltage supply circuit 20.

One end of a microstrip line 1 shorter than ¼ the wavelength λg (λg/4) of the carrier frequency of the microwave signal is connected to the drain D of the FET 10. The microstrip line 1 serves as a low-pass filter which blocks the carrier signal and passes only a beat signal, and is arranged near the drain D of the FET 10. The other end of the microstrip line 1 is grounded through a capacitor 5 (capacitance element) that short-circuits a beat signal frequency generated due to the plurality of carrier frequencies. The microstrip line 1 and the capacitor 5 constitute a beat smoothing circuit (beat removing circuit) 30.

In the microwave amplifier having the above arrangement, since the DC bias voltage supply circuit 20 having the λg/4 line 11 is connected to the main line connected to the drain D of the FET 10, the main line has a high impedance with respect to the carrier frequency, in the same manner as in the prior art shown in FIGS. 9A and 9B. As a result, leakage (runaround) of the microwave signal to the DC bias voltage $V_{DS}$ side can be prevented.

The beat signal which has passed through the microstrip line 1 shorter than λg/4 is short-circuited to ground through the capacitor 5. As a result, the beat signal on the main line is attenuated and the influence of the beat signal is decreased.

Since the microstrip line 1 shorter than λg/4 is connected near the drain D of the FET 10, the inductance component of this line 1 can be decreased more than in a case wherein the line length from the drain D of the FET 10 to the microstrip line 1 is large. As a result, the beat smoothing circuit 30 can decrease the beat signal efficiently.

It is most preferable that the microstrip line 1 be connected to the root (the connecting point to the main line) of the terminal of the drain D of the FET 10 so that an extra inductance component will not be added. The λg/4 line 11 may be arranged at any portion of the line connected to the drain D of the FET 10.

The function of the beat smoothing circuit 30 will be described. The connecting point between the capacitor 5 that short-circuits the beat signal and the microstrip line 1 short-circuits the beat signal. When seen from the drain D of the FET 10, however, the reactance with respect to the beat signal of the beat smoothing circuit depends on the electric length of the beat signal of the microstrip line.

A reactance jX with respect to the beat signal of the beat smoothing circuit when seen from the drain D of the FET 10 is given by the following equation:

$$jX = Z \cdot \tan(\beta \cdot L)$$

where Z is the impedance of the microstrip line 1, β is the phase constant of the beat signal, and L is the length of the microstrip line 1.

β is a value unique to the beat signal. The smaller the impedance Z or the smaller the length L of the microstrip line 1, the smaller the reactance jX. To reduce the impedance Z of the microstrip line 1, the width of the microstrip line 1 must be increased, which has mounting limitations. Accordingly, to decrease the reactance jX is realized by decreasing the length L of the microstrip line 1.

Figure 2:
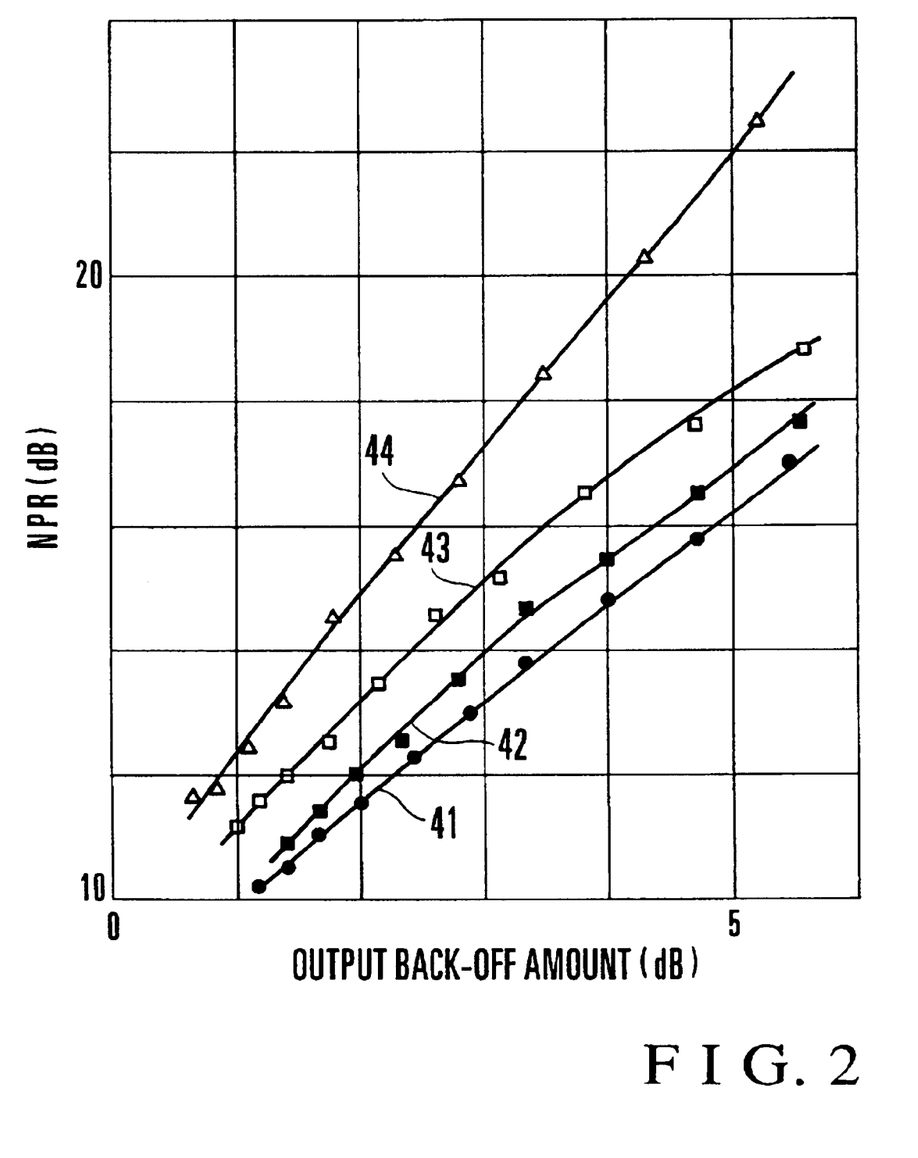
FIG. 2 is a graph showing NPR characteristics obtained when a length L of the strip line of the beat smoothing circuit is changed.

FIG. 2 shows a change in NPR (Noise Power Ratio) characteristics with respect to the length L of the microstrip line 1 of the beat smoothing circuit 30. Referring to FIG. 2, reference numeral 41 denotes a case wherein L=λg/4; 42, L=3λg/16; 43, L=λg/8; and 44, L=λg/20, respectively. The NPR is one of the performance indices that indicate the linear characteristics of a power amplifier.

When a signal having a plurality of frequencies is supplied to the amplifier, many unnecessary signal components are generated in the output signal from the amplifier, in addition to the input signal component, due to the distortion characteristics. The resultant distortion signal component degrades the quality of the signal output from the amplifier. In particular, in mobile communication and the like, a large number of communication stations for the mobile telephone are used, and one amplifier amplifies a large number of signals. To evaluate the linear characteristics with these conditions, a large number of signal generators must be prepared. Accordingly, the linear characteristics cannot actually be evaluated. Instead, a method of evaluating the linear characteristics of the amplifier by using noise as an input signal is proposed.

According to this method, a very narrow slit (band) having no noise signal is provided in a noise signal. This noise is input to an amplifier. The power ratio of the power density occurred in the slit on the output side to the noise signal density is measured. In this case, the larger the power density occurred in the slit, the worse the linear characteristics of the amplifier. The measured power ratio is called an NPR. It is determined that the larger the absolute value of NPR, the smaller the distortion in amplification of the signal having a plurality of frequencies, providing better linear characteristics.

Therefore, when the microstrip line 1 shorter than λ/g is used, jX can be decreased as compared to the λg/4 line. When the line is grounded through the capacitor 5 that short-circuits the beat signal frequency, the beat signal generated due to the plurality of carrier frequencies can be reliably decreased.

This is apparent from FIG. 2 wherein, when the line length L of the microstrip line 1 is set to be equal to or less than 3λg/16, the NPR characteristics are greatly improved over the wide range of the output back-off amount as compared to a case wherein L=λg/4.

The second embodiment of the present invention will be described with reference to FIGS. 3A and 3B.

Figure 3A:
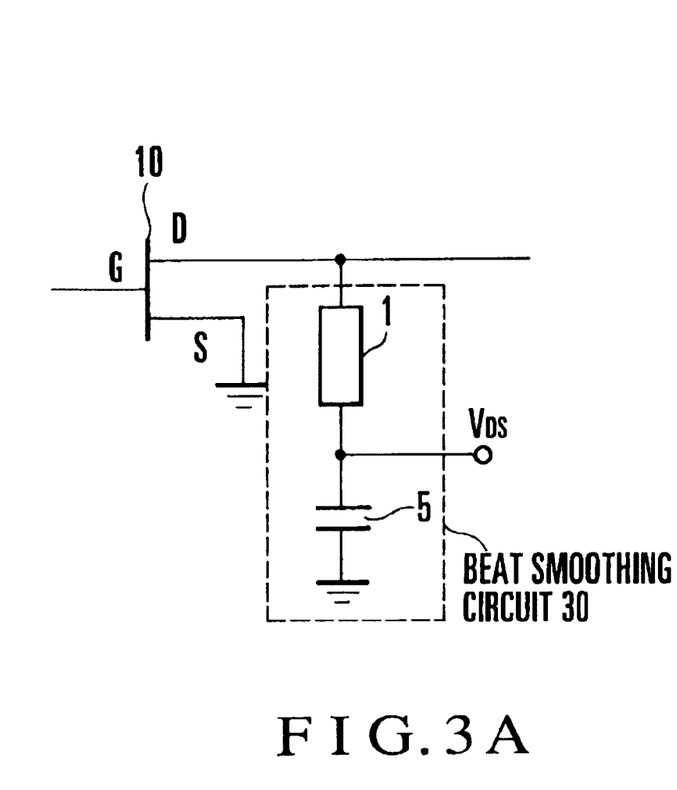
FIGS. 3A and 3B are plan views showing the circuit diagram and the mounted state, respectively, of the main part of a microwave amplifier according to the second embodiment of the present invention.
Figure 3B:
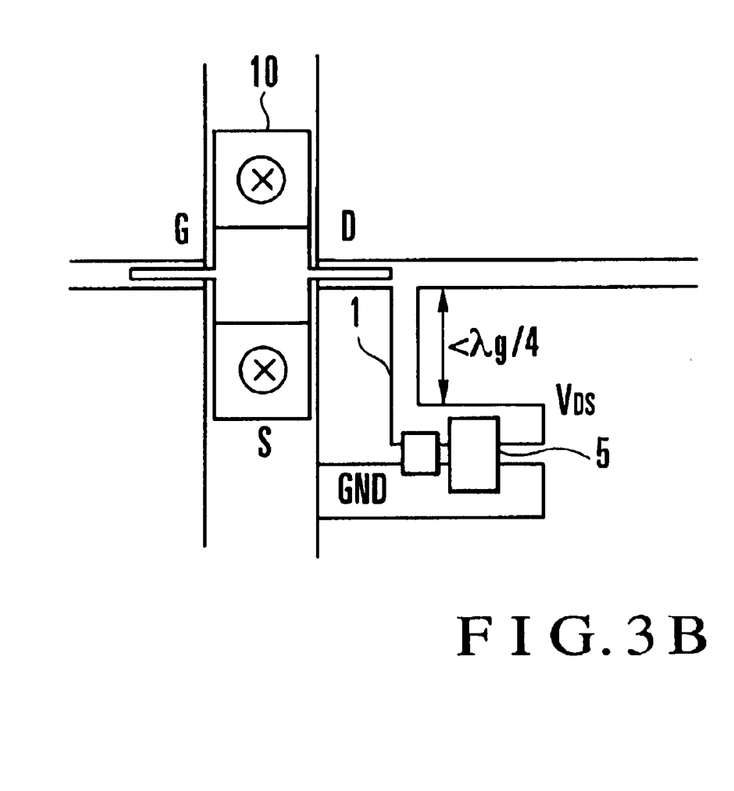

Referring to FIGS. 3A and 3B, portions that are the same or identical to those in FIGS. 1A and 1B are denoted by the same reference numerals as in FIGS. 1A and 1B. The second embodiment is different from the first embodiment in that the DC bias voltage supply circuit 20 is omitted and a DC bias voltage $V_{DS}$ is supplied to a drain D of an FET 10 through a microstrip line 1 of a beat smoothing circuit 30.

More specifically, as shown in FIG. 3A, the DC bias voltage $V_{DS}$ is connected to the connecting point between the microstrip line 1 and a capacitor 5, and the DC bias voltage $V_{DS}$ is supplied from this connecting point to the drain D of the FET 10 through the microstrip line 1 shorter than λg/4. The beat signal is short-circuited to ground through the beat smoothing circuit 30 constituted by the microstrip line 1 and capacitor 5 in the same manner as in the first embodiment.

According to the second embodiment, since the DC bias voltage $V_{DS}$ is supplied through the microstrip line 1 of the beat smoothing circuit 30, the beat signal can be decreased by the beat smoothing circuit 30, in the same manner as in the first embodiment. An exclusive DC bias voltage supply circuit (corresponding to the $\mu g/4$ line 11 and the capacitor 15 of FIGS. 1A and 1B) for supplying the DC bias voltage $V_{DS}$ to the drain D of the FET 10 becomes unnecessary. As a result, as shown in FIG. 3B, the number of components constituting the circuit can be decreased and the circuit area can be decreased, so that the amplifier can be downsized.

The third embodiment of the present invention will be described with reference to FIGS. 4A and 4B.

Figures 4A, 4B:
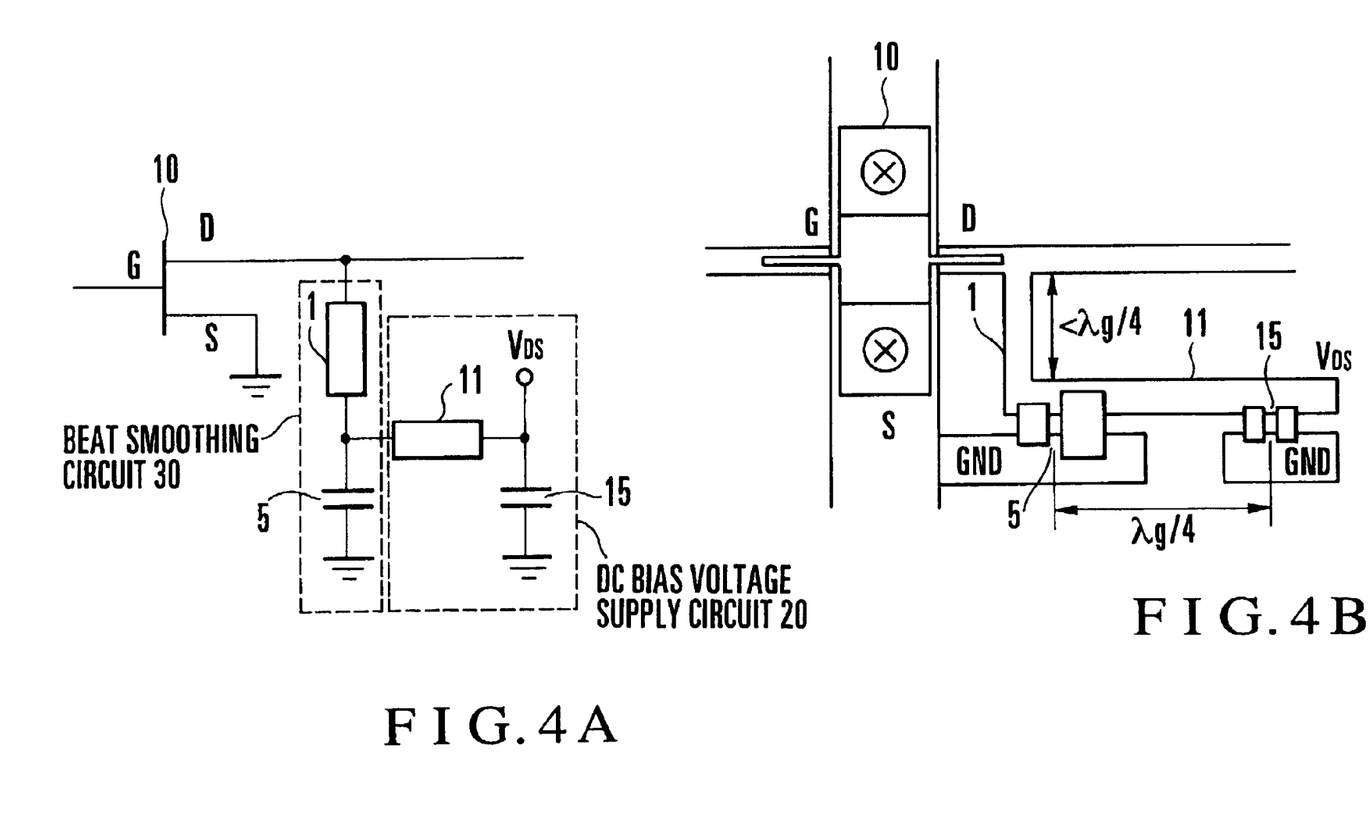
FIGS. 4A and 4B are plan views showing the circuit diagram and the mounted state, respectively, of the main part of a microwave amplifier according to the third embodiment of the present invention.

Referring to FIGS. 4A and 4B, portions that are the same or identical to those in FIGS. 1A and 1B are denoted by the same reference numerals as in FIGS. 1A and 1B. The third embodiment is different from the first embodiment in that a DC bias voltage $V_{DS}$ is supplied to a drain D of an FET 10 through a $\lambda g/4$ line 11 and a microstrip line 1 of a beat smoothing circuit 30.

More specifically, as shown in FIG. 4A, the DC bias voltage $V_{DS}$ is connected to the connecting point between the microstrip line 1 and a capacitor 5 that constitute the beat smoothing circuit 30, through the $\lambda g/4$ line 11. The DC bias voltage $V_{DS}$ is accordingly supplied to the drain D of the FET 10 through the $\lambda g/4$ line 11 and the microstrip line 1 shorter than $\lambda g/4$. The other end of the $\lambda g/4$ line 11 connected to the beat smoothing circuit 30 is grounded through a capacitor 15 that short-circuits the input signal. The capacitor 15 and the $\lambda g/4$ line 11 constitute a DC bias voltage supply circuit 20.

The beat signal is short-circuited to ground through the beat smoothing circuit 30 constituted by the microstrip line 1 and the capacitor 5, in the same manner as in the first embodiment.

Since the third embodiment has the beat smoothing circuit 30 constituted by the microstrip line 1 shorter than $\lambda g/4$ and the capacitor 5 that short-circuits the beat signal frequency, in the same manner as in the first embodiment, it can decrease the beat signal.

Since the DC bias voltage supply circuit 20 having the $\lambda g/4$ line 11 is connected to the connecting point between the microstrip line 1 and capacitor 5, a high impedance can be obtained with respect to the carrier signal, in the same manner as in the prior art (FIGS. 9A and 9B). As a result, leakage of the microwave signal to the DC bias voltage $V_{DS}$ side can be prevented.

As shown in FIG. 4B, the beat smoothing circuit 30 and the DC bias voltage supply circuit 20 can be arranged close to one side (the lower portion in the drawing) of the line connected to the drain D of the FET 10, so that the area occupied by the beat smoothing circuit 30 and DC bias voltage supply circuit 20 can be decreased to be smaller than in the first embodiment.

The fourth embodiment of the present invention will be described with reference to FIGS. 5A and 5B.

Figure 5A:
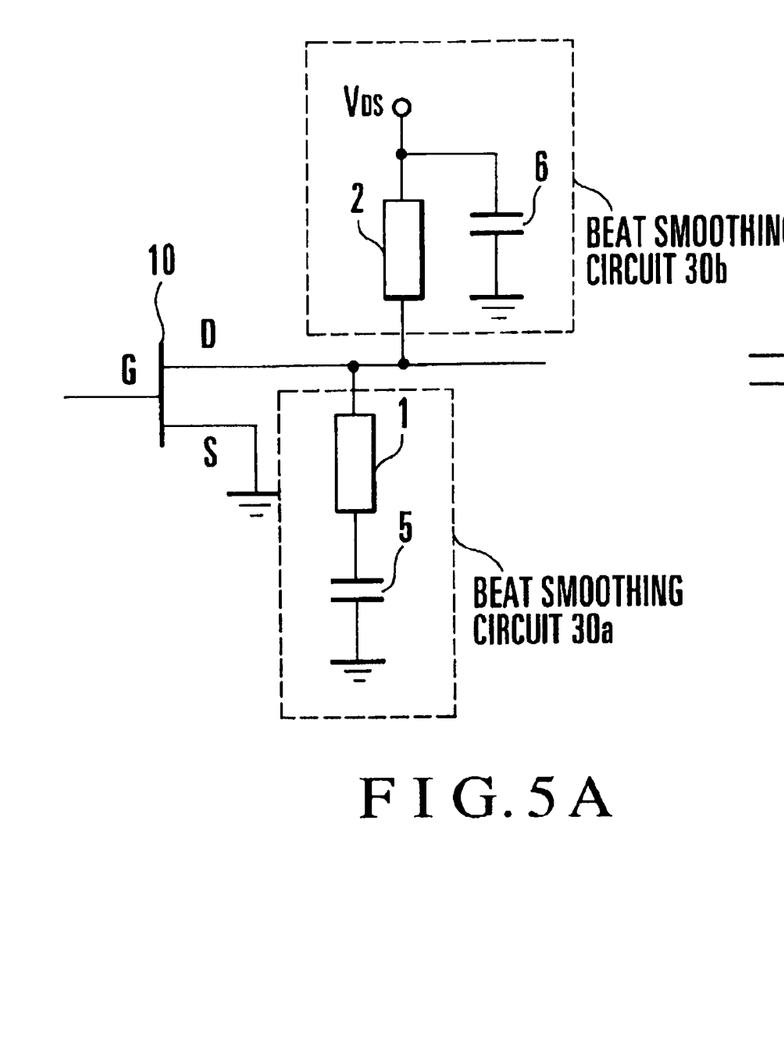
FIGS. 5A and 5B are plan views showing the circuit diagram and the mounted state, respectively, of the main part of a microwave amplifier according to the fourth embodiment of the present invention.
Figure 5B:
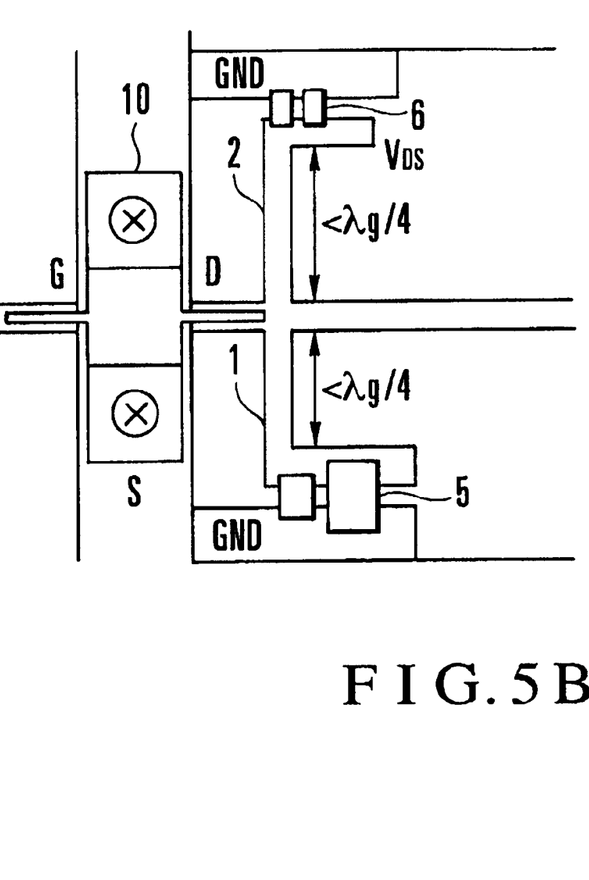

Referring to FIGS. 5A and 5B, portions that are the same or identical to those in FIGS. 1A and 1B are denoted by the same reference numerals as in FIGS. 1A and 1B. The fourth embodiment is different from the first embodiment in that a DC bias voltage $V_{DS}$ is supplied to a drain D of an FET 10 through a microstrip line 2 which is shorter than $\lambda g/4$ and which constitutes another beat smoothing circuit, in place of the $\lambda g/4$ line 11 of the first embodiment.

More specifically, as shown in FIG. 5A, one end of the microstrip line 2 shorter than ¼ the wavelength $\lambda g$ of the carrier frequency of the microwave signal, i.e., shorter than $\lambda g/4$, is connected to the drain D of the FET 10. The other end of the microstrip line 2 is connected to the DC bias voltage $V_{DS}$ and is grounded through a capacitor 6 that short-circuits the beat signal. Accordingly, the DC bias voltage $V_{DS}$ is supplied to the drain D of the FET 10 through the microstrip line 2 shorter than $\lambda g/4$. The capacitor 6 and the microstrip line 2 shorter than $\lambda g/4$ constitute a second beat smoothing circuit 30*b*.

The beat signal is short-circuited to ground through a first beat smoothing circuit 30*a* constituted by a microstrip line 1 and a capacitor 5, in the same manner as in the first embodiment. Since the DC bias voltage $V_{DS}$ is supplied through the microstrip line 2 shorter than $\lambda g/4$, the beat signal can be attenuated on the supply side of the DC bias voltage $V_{DS}$ as well.

Although the DC bias voltage $V_{DS}$ is supplied through the second beat smoothing circuit 30*b*, it may be supplied to a line connected to the drain D of the FET 10 through the first beat smoothing circuit 30*a*.

According to this embodiment, as shown in FIG. 5B, the first and second beat smoothing circuits 30*a* and 30*b* are arranged, between the FET 10 and ground (GND), axisymmetrically with respect to the main line connected to the drain D of the FET 10. This further improves the effect of smoothing the beat signal more than in the first to third embodiments.

The fifth embodiment of the present invention will be described with reference to FIGS. 6A and 6B.

Figure 6A:
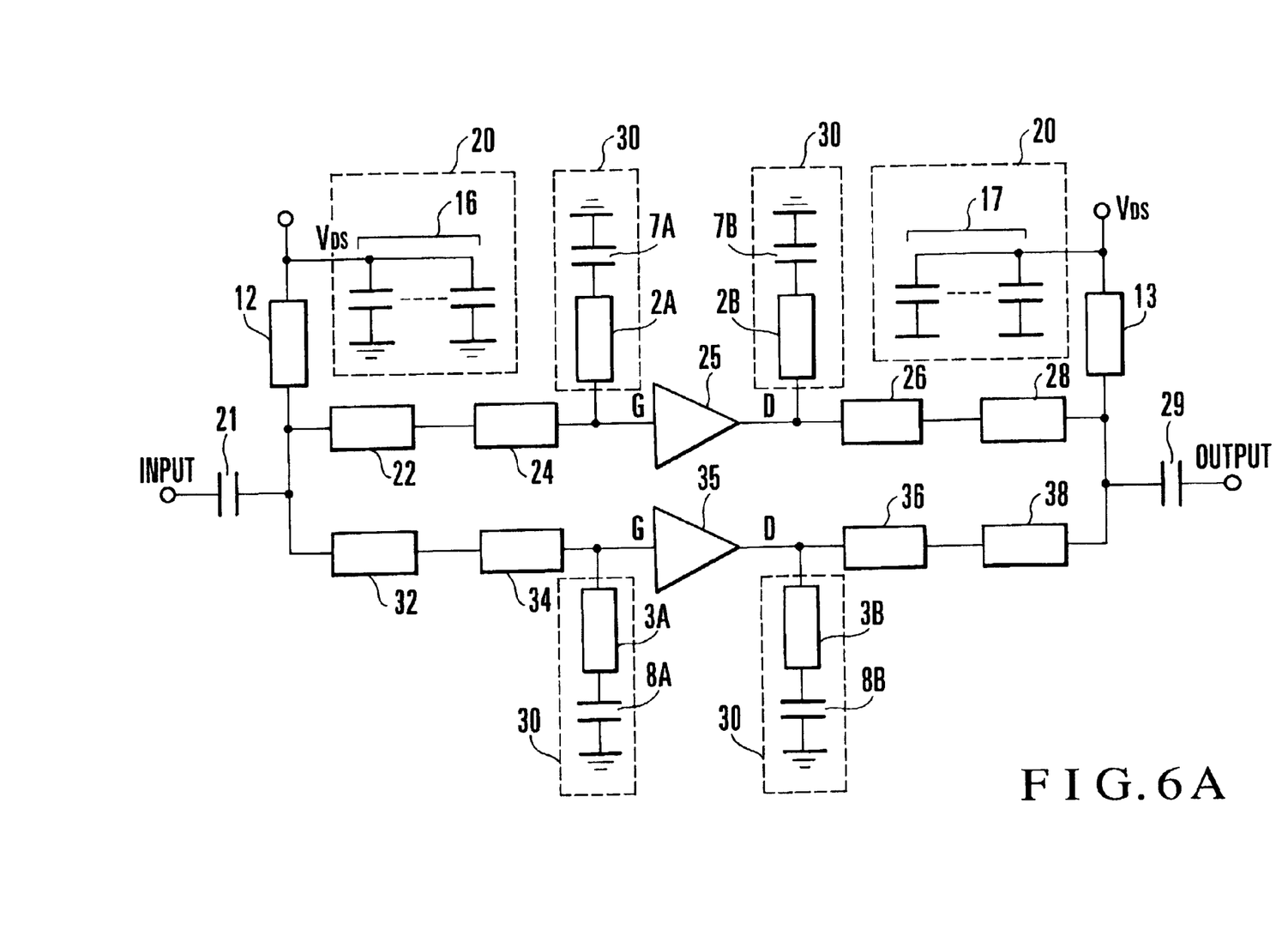
Figure 6B:
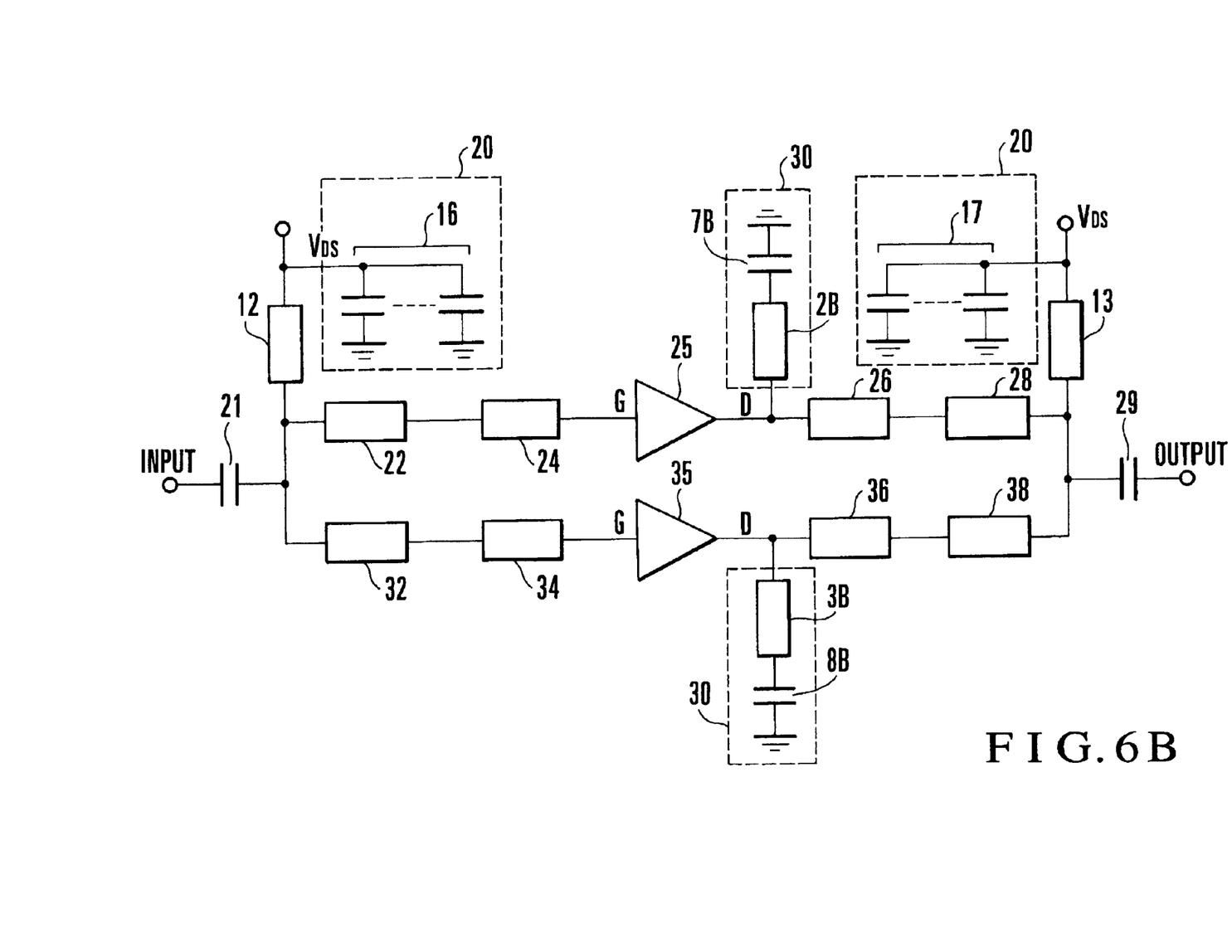

FIG. 6A shows a case wherein beat smoothing circuits are arranged on the two sides of gates G and drains D of a plurality of FETs 25 and 35 constituting an amplifier, and FIG. 6B shows a case wherein beat smoothing circuits are arranged on only the drain D side of FETs 25 and 35.

Figure 10:
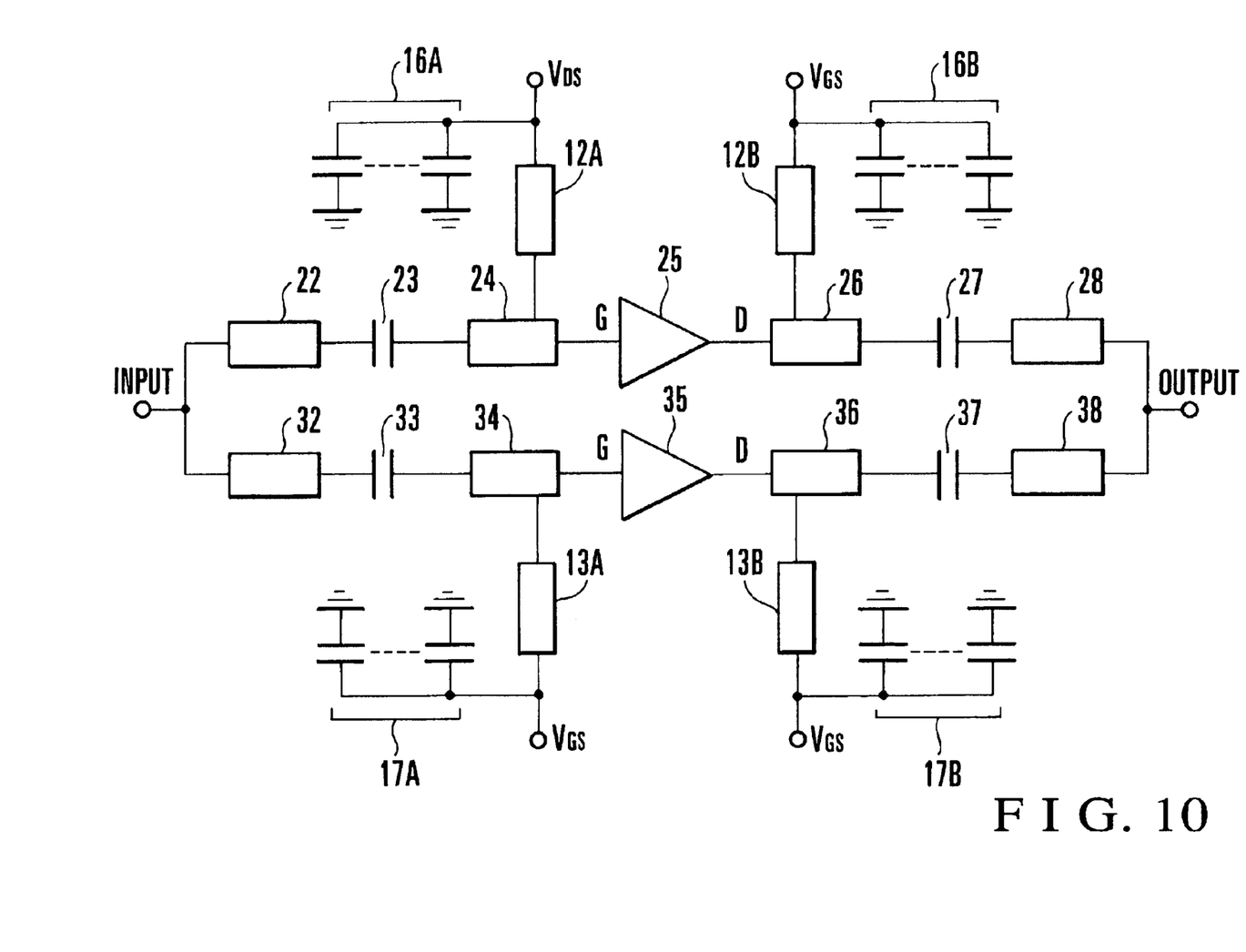
FIG. 10 is a circuit diagram of a conventional microwave amplifier having a plurality of FET circuits.

In the microwave amplifier in which the plurality of FETs 25 and 35 are operated in parallel to each other in this manner, as shown in FIG. 10, a circuit arrangement is possible in which $\lambda g/4$ lines 12A, 12B, 13A, and 13B, and capacitors C 16A, 16B, 17A, and 17B are arranged and predetermined DC bias voltages $V_{GS}$ and $V_{DS}$ are supplied to gates G and drains D of the FETs 25 and 35. Reference numerals 22, 24, 32, and 34 denote input matching circuits; 26, 28, 36, and 38, output matching circuits; and 23, 27, 33 and 37, DC blocking capacitors.

Figure 11:
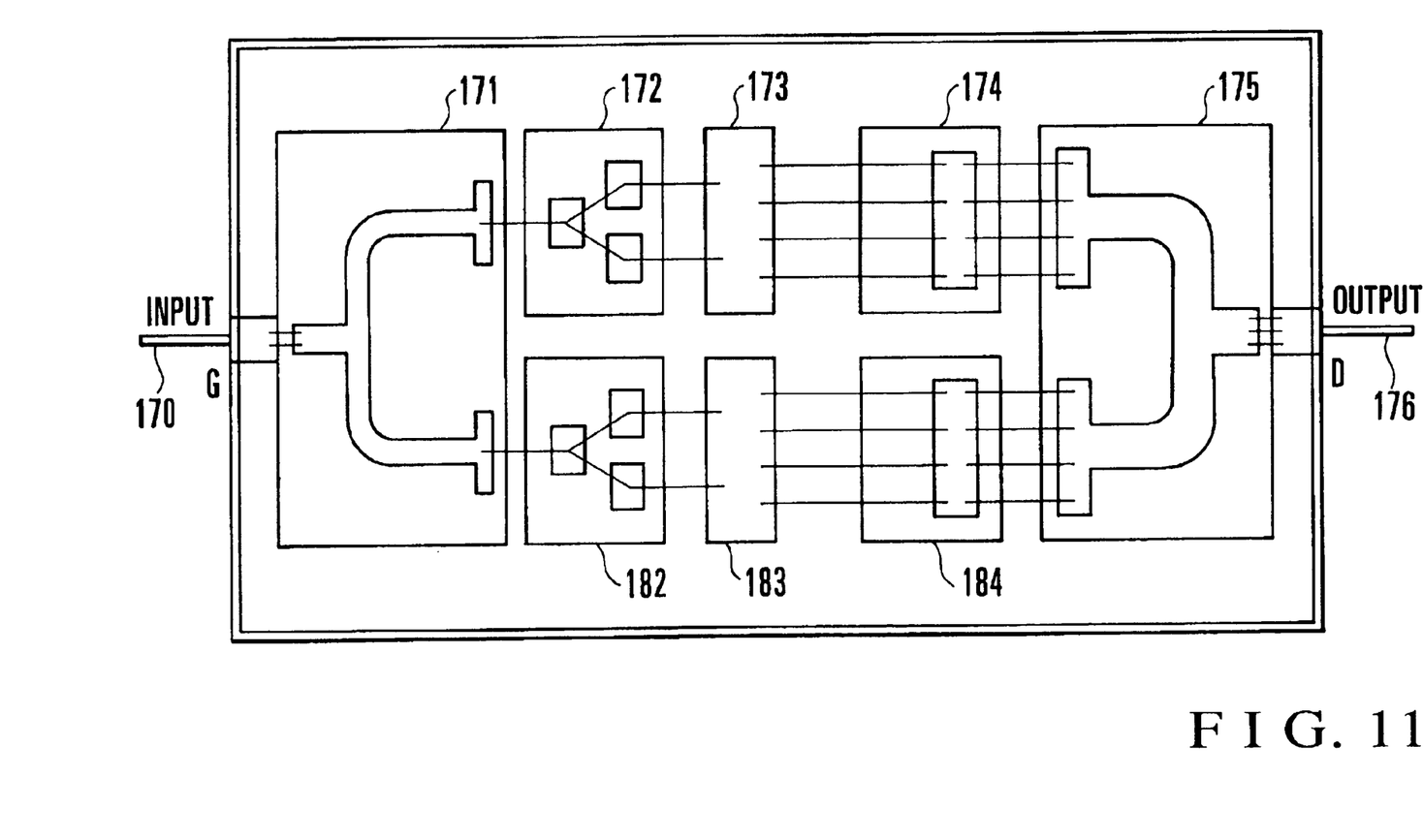
FIG. 11 is a plan view showing the mounted state of the microwave amplifier shown in FIG. 10.

In the example of the microwave amplifier shown in FIG. 10, since a large number of $\lambda g/4$ lines are required for supplying the DC bias voltage and the number of connecting circuits connected to the outside is increased, the size of the microwave amplifier increases, rendering downsizing impossible. FIG. 11 shows the mounted state of the microwave amplifier shown in FIG. 10. Reference numeral 170 denotes a gate terminal; 171, a distribution circuit; 172 and 182, input matching circuits; 173 and 183, FET circuits; 174 and 184, output matching circuits; 175, a synthesizing circuit; and 176, a drain terminal.

In the fifth embodiment of the present invention, the distributing line (distributing point) for distributing the microwave to the FETs 25 and 35 that are operated in parallel to each other, and the synthesizing line for synthesizing the amplified outputs from the FETs 25 and 35 respectively supply the DC bias voltages $V_{GS}$ and $V_{DS}$ to the gates G (input terminals) and the drains D (output terminals) of the FETs 25 and 35. Also, the beat smoothing circuits for attenuating the beat signal are arranged near the gates G and drains D of the FETs 25 and 35.

More specifically, as shown in FIGS. 6A and 6B, one end of a $\lambda g/4$ line 12 is connected to the distributing line connected to a capacitor C 21 and input matching circuits 22 and 32. The other end of the λg/4 line 12 is grounded through a plurality of parallel-connected capacitors 16 that short-circuit the carrier frequency of the microwave signal, and is connected to the DC bias voltage $V_{DS}$.

One end of a λg/4 line 13 is connected to the synthesizing line connected to the output matching circuits 28 and 38 and a capacitor C 29. The other end of the λg/4 line 13 is grounded through a plurality of parallel-connected capacitors 17 that short-circuit the carrier frequency of the microwave, and is connected to the DC bias voltage $V_{DS}$. The λg/4 lines 12 and 13 and the capacitors 16 and 17 constitute power supply voltage bias supply circuits 20.

Furthermore, in FIG. 6A, microstrip lines 2A and 3A, and 2B and 3B each shorter than λg/4 are connected to both the gates G and drains D of the FETs 25 and 35. The other end of each of the microstrip lines 2A, 2B, 3A, and 3B is grounded through a corresponding one of capacitors 7A, 7B, 8A, and 8B that short-circuit the beat signal frequency. These microstrip lines 2A, 2B, 3A, and 3B and capacitors 7A, 7B, 8A, and 8B constitute beat smoothing circuits 30.

In FIG. 6B, the beat smoothing circuits 30, constituted by the capacitors 8A and 8B and the microstrip lines 3A and 3B shorter than λg/4, are connected to only the drain D side of the FETs 25 and 35.

As a result, circuits 20 for supplying the DC bias voltages $V_{GS}$ and $V_{DS}$ to the gates G and drains D of the FETs 25 and 35 can be shared. Unlike in the conventional case, capacitors 23, 33, 27, and 37 for blocking the DC bias voltage need not be arranged. Accordingly, the number of components constituting the circuit can be decreased and the circuit area can be decreased, so that the amplifier can be downsized.

The six embodiment of the present invention will be described with reference to FIG. 7.

Figure 7:
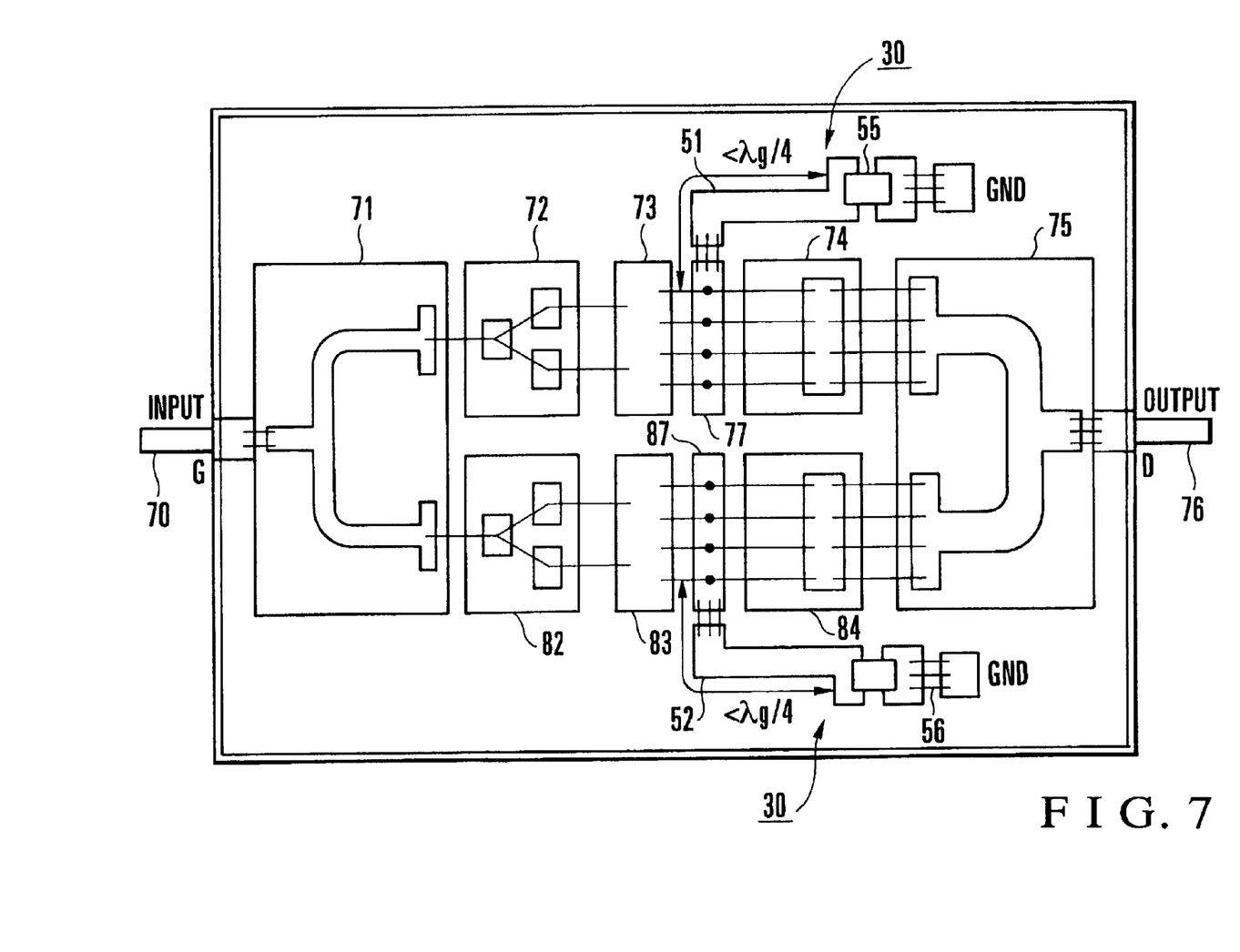
FIG. 7 is a plan view showing the mounted state of a microwave amplifier according to the sixth embodiment of the present invention.

FIG. 7 shows an internal matching type microwave amplifier (transistor) for matching a plurality of FETs that operate in parallel to each other in a package. In such an internal matching type microwave amplifier for matching the plurality of FETs that operate in parallel to each other in the package, a distribution circuit 71, input matching circuits 72 and 82, FET circuits 73 and 83, output matching circuits 74 and 84, and a synthesizing circuit 75 are arranged in the package.

A microwave signal input to a gate terminal 70 is distributed to the input matching circuits 72 and 82 by the distribution circuit 71. The distributed signals are impedance-matched by the input matching circuits 72 and 82 by inductances, capacitances, and the like. These signals are then input to FETs that are arranged in the FET circuits 73 and 83 and that operate in parallel to each other. The input signals are amplified and output. The amplified signals are impedance-matched in the output matching circuits 74 and 84 by inductances, capacitances, or the like. Then, all the amplified outputs are synthesized by the synthesizing circuit 75, and the resultant signal is output from a drain terminal 76.

However, when a microwave signal including a large number of carrier frequencies is input to the microwave amplifier described above, a low-frequency beat signal is generated due to these carrier frequencies. Then, a reactance component jX, e.g., a phase angle, generated by the transmission lines of the inductances and capacitances of the input matching circuits 72 and 82, the distribution circuit 71, and synthesizing circuit 75, causes a distortion in the amplified outputs from the FET circuits 73 and 83.

According to the sixth embodiment, as shown in FIG. 7, bonding patterns 77 and 87 extending from drains D of the FET circuits 73 and 83 are arranged near the drains D, and the bonding patterns 77 and 87 and the drains D of the FET circuits 73 and 83 are connected to each other. Furthermore, one end of the bonding pattern 77 is connected to a microstrip line 51 shorter than λg/4, and one end of the bonding pattern 87 is connected to a microstrip line 52 shorter than λg/4. A capacitor 55 is connected between the other end of the microstrip line 51 and ground potential (GND), and a capacitor 56 is connected between the other end of the microstrip line 52 and ground potential (GND). The capacitors 55 and 56 short-circuit the beat signal. The microstrip lines 51 and 52, and the capacitors 55 and 56 constitute beat smoothing circuits 30.

Hence, in the load-side impedance seen from the FET side, the reactance component jX is increased due to the transmission lines of the inductors and capacitors of the output matching circuits 74 and 84, the synthesizing circuit 75, and the like. If, however, the beat smoothing circuits 30 are arranged near the drains D symmetrically, the reactance component jX can be decreased. Accordingly, the low-frequency beat signal caused by the large number of carrier frequencies is attenuated, and distortion in amplified output can be decreased.

According to this embodiment, even if a microwave including a large number of carrier frequencies is input to an internal matching type microwave amplifier that matches a plurality of FETs that operate in parallel to each other in the package, the low-frequency beat signal caused by the large number of carrier frequencies can be attenuated, thereby decreasing distortion in amplified output.

In the sixth embodiment, the beat smoothing circuits 30 constituted by the microstrip lines 51 and 52 each shorter than λg/4 and the capacitors 55 and 56 for beat signal short-circuiting are arranged in the package. However, the present invention is not limited to this. For example, as shown in FIG. 8, connecting terminals (connectors) 78 and 88 may be formed on the package, and beat smoothing circuits 30 arranged outside the package may be connected to the package through the connectors 78 and 88.

More specifically, when smoothing is to be performed to cover even a very low beat frequency, large capacitors are required as the capacitors 55 and 56 that short-circuit the beat signal. This increases the size of the capacitors that short-circuit the beat signal, and these capacitors cannot be stored in one package, unlike in FIG. 7.

Figure 8:
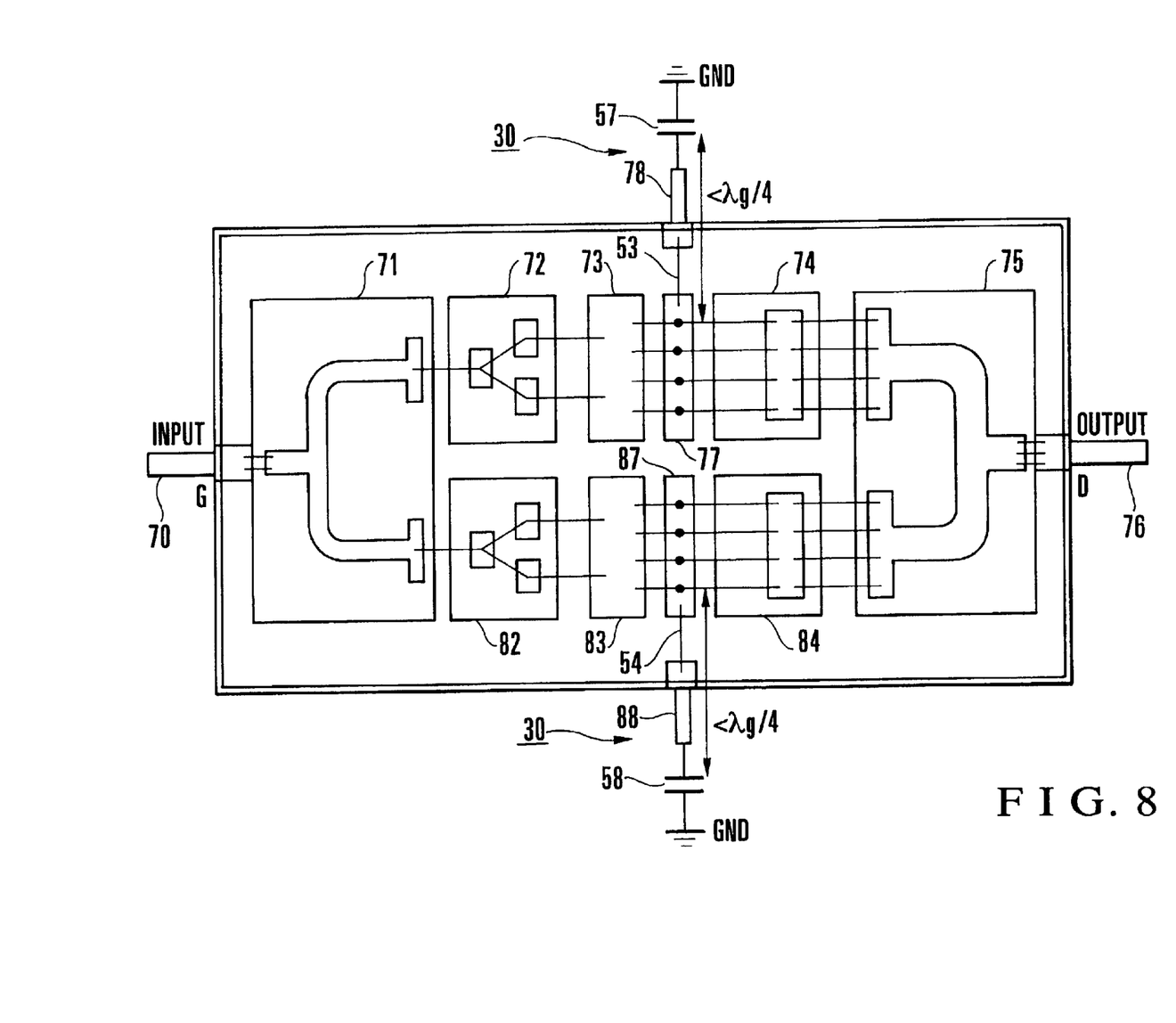
FIG. 8 is a plan view showing the mounted state of a microwave amplifier according to the seventh embodiment of the present invention.

According to the embodiment shown in FIG. 8, the outputs from the FET circuits 73 and 83 are respectively connected to bonding patterns 77 and 87. Beat smoothing circuits 30 constituted by microstrip lines 53 and 54 and capacitors 57 and 58 are arranged outside the package through the terminals 78 and 78 (connecting means). Each of the microstrip lines 53 and 54 is shorter than λg/4 and has one end connected to a corresponding one of the bonding patterns 77 and 87. Each of the capacitors 57 and 58 is arranged between the other end of the corresponding one of the microstrip lines 53 and 54, that are shorter than λg/4, and ground (GND), to short-circuit the beat signal.

According to this embodiment, since the capacitors for beat signal smoothing are not mounted in the package, the package size need not be unnecessarily increased. Even when the beat signal frequency component changes depending on application purposes, capacitors 57 and 58 having different capacitances need only be attached to the outside of the package. Hence, packaged amplifiers having the same arrangement can be used for various applications.

In FIGS. 7 and 8, explanation is made by way of an internal matching type microwave amplifier that matches a plurality of FETs that operate in parallel to each other in a package. However, the present invention can be applied not only to matching of the plurality of FETs that operate in parallel to each other but also to matching of a plurality of FETs that operate singly while obtaining the same function and effect as those described above.

Furthermore, the present invention can be applied not only to a microwave integrated circuit having a plurality of FETs that are stored in a package but also to a microwave integrated circuit having a plurality of FETs that operate in parallel to each other by using discrete components while obtaining the same function and effect as those described above.

In the above description, a λg/4-length microstrip line is used as an inductor which has a high impedance with respect to the carrier frequency of a microwave signal, and a microstrip line shorter than λg/4 is used as an inductor which decreases the beat signal. However, these inductors are not limited to microstrip lines. These microstrip lines may be replaced with choke coils having an inductance equivalent to that of the corresponding microstrip line, while providing the same function and effect as those described above.

As has been described above, according to the present invention, the beat signal caused by a difference among a plurality of carrier frequencies included in a microwave signal can be reliably attenuated. Even when the microwave signal to be amplified includes a large number of carrier frequencies, good distortion characteristics can be obtained.

A beat smoothing circuit having a microstrip line is arranged at the output terminal of the active element or in the line near the output terminal. Therefore, the inductance component generated by the line distance from the output terminal of the active element to the microstrip line can be decreased, thereby decreasing the beat signal more efficiently.

Since a DC bias voltage is supplied to the FET through the beat smoothing circuit, a circuit for supplying the DC bias voltage to the output terminal of the active element becomes unnecessary. The number of components constituting the circuit can be decreased, and the circuit area can be decreased, so that the amplifier can be downsized.

What is claimed is:

1. A microwave amplifier comprising:
   an active element for amplifying a microwave signal including a plurality of carrier frequencies that are different from each other;
   DC bias voltage supply means for supplying a DC bias voltage to said active element; and
   a first beat smoothing means for smoothing a beat frequency generated on a line connected to said active element due to a difference among the plurality of carrier frequencies, said first beat smoothing means being constituted by filter means having a low impedance with respect to the beat frequency, and short-circuiting means for short-circuiting to ground the beat frequency output from said filter means, wherein
   said filter means comprises a first microstrip line connected to a terminal of said active element and shorter than λg/4 (where λg is the wavelength of the microwave signal),
   said short-circuiting means comprises a first capacitance element connected between the other end of said first microstrip line and ground, and
   said DC bias voltage supply means comprises a second microstrip line and a second capacitance element.

2. An amplifier according to claim 1, wherein said first microstrip line has a length not more than 3λg/16.

3. An amplifier according to claim 1, wherein said first beat smoothing means is arranged on an output terminal side of said active element.

4. An amplifier according to claim 3, wherein one end of said first microstrip line is connected to a portion near a connecting point between said output terminal of said active element and said line.

5. An amplifier according to claim 3, wherein said DC bias voltage supply means supplies a DC bias voltage to said line connected to said output terminal of said active element, and
   said first beat smoothing means smoothes a beat frequency generated on the line connected to said output terminal of said active element.

6. An amplifier according to claim 1, wherein said DC bias voltage supply means comprises
   a second microstrip line having a length λg/4,
   a second capacitance element connected between the other end of said second microstrip line and ground, and
   a DC bias supply ($V_{DS}$) connected to a connecting point between the other end of said second microstrip line and said capacitance element to supply the DC bias voltage through said second microstrip line.

7. An amplifier according to claim 1, wherein said DC bias voltage supply means supplies the DC bias voltage to said connecting point between said first microstrip line and said first capacitance element.

8. An amplifier according to claim 7, wherein said DC bias voltage supply means comprises a DC bias supply ($V_{DS}$) connected between said first microstrip line and said first capacitance element.

9. An amplifier according to claim 1, further comprising:
   second beat smoothing means having a second microstrip line and a second capacitance element, said second microstrip line having one end connected to said terminal of said active element and being shorter than λg/4, and said second capacitance element being connected to the other end of said second microstrip line and ground, and
   wherein said DC bias voltage supply means has a DC bias supply ($V_{DS}$) for supplying the DC bias voltage to a connecting point between the other end of said second microstrip line and said second capacitance element.

10. An amplifier according to claim 9, wherein said second microstrip line has a length not more than 3λg/16.

11. A microwave amplifier comprising:
    a plurality of active elements to which a DC bias voltage is supplied to amplify a microwave signal;
    a distributor for distributing the microwave signal including a plurality of carrier frequencies that are different from each other to said plurality of active elements;
    a plurality of first beat smoothing circuits for smoothing a beat signal caused by a difference among the plurality of carrier frequencies, each of said plurality of first beat smoothing circuits having a first microstrip line having one end connected to an output terminal of a corresponding one of said plurality of active elements, having a low impedance with respect to the beat frequency, and being shorter than λg/4 (where λg is the wavelength of the microwave signal), and a first capacitance element connected between the other end of said first microstrip line and ground to short-circuit the beat frequency on said first microstrip line; and
    a synthesizer for synthesizing output signals from said plurality of active elements and outputting a synthesis signal.

12. An amplifier according to claim 11, further comprising a plurality of second beat smoothing circuits arranged on an input terminal side of said plurality of active elements to smooth a beat frequency generated by a difference among the plurality of carrier frequencies.

13. An amplifier according to claim 11, further comprising first and second DC bias voltage supply circuits for supplying DC bias voltages to an input stage of said distributor and an output stage of said synthesizer, respectively.

14. An amplifier according to claim 13, wherein each of said first and second DC bias voltage supply circuits comprises a microstrip line having a length $\lambda g/4$, a capacitance element connected between said second microstrip line and ground, and a DC bias supply ($V_{DS}$) for supplying a DC bias voltage to a connecting point between said microstrip line and said capacitance element.

15. An amplifier according to claim 11, further comprising:

a plurality of input matching circuits connected between said distributor and said plurality of active elements; and a plurality of output matching circuits connected between said plurality of active elements and said synthesizer.

16. An amplifier according to claim 15, wherein said distributor, said input matching circuits, said plurality of active elements, said first microstrip line, said capacitance element, said output matching circuits, and said synthesizer are stored in one package.

17. An amplifier according to claim 11, further comprising a plurality of connecting means for attaching said plurality of capacitance elements on an outer side of a package.

18. A microwave amplifier comprising:

an active element for amplifying a microwave signal including a plurality of carrier frequencies that are different from each other;

DC bias voltage supply circuit for supplying a DC bias voltage to said active element; and a first beat smoothing circuit for smoothing a beat frequency generated on a line connected to said active element due to a difference among the plurality of carrier frequencies, said first beat smoothing circuit being constituted by a filter having a low impedance with respect to the beat frequency, and a capacitance element short-circuiting for short-circuiting to ground the beat frequency output from said filter, wherein said filter comprises a first microstrip line connected to a terminal of said active element and shorter than $\lambda g/4$ (where $\lambda g$ is the wavelength of the microwave signal);

said capacitance element comprises a first capacitance element connected between the other end of said first microstrip line and ground, and said DC bias voltage supply means comprises a second microstrip line and a second capacitance element.

19. An amplifier according to claim 18, wherein said first microstrip line has a length not more than $3\lambda g/16$.

20. An amplifier according to claim 18, wherein said first beat smoothing circuit is arranged on an output terminal side of said active element.

21. An amplifier according to claim 20, wherein one end of said first microstrip line is connected to a portion near a connecting point between said output terminal of said active element and said line.

22. An amplifier according to claim 20, wherein:

said DC bias voltage supply circuit supplies a DC bias voltage to said line connected to said output terminal of said active element, and said first beat smoothing circuit smoothes a beat frequency generated on the line connected to said output terminal of said active element.

23. An amplifier according to claim 18, wherein said DC bias voltage supply circuit comprises:

a second microstrip line having a length $\lambda g/4$, a second capacitance element connected between the other end of said second microstrip line and ground, and a DC bias supply ($V_{DS}$) connected to a connecting point between the other end of said second microstrip line and said capacitance element to supply the DC bias voltage through said second microstrip line.

24. An amplifier according to claim 18, wherein said DC bias voltage supply circuit supplies the DC bias voltage to said connecting point between said first microstrip line and said first capacitance element.

25. An amplifier according to claim 24, wherein said DC bias voltage supply circuit comprises a DC bias supply ($V_{DS}$) connected between said first microstrip line and said first capacitance element.

26. An amplifier according to claim 18, further comprising:

second beat smoothing means having a second microstrip line and a second capacitance element, said second microstrip line having one end connected to said terminal of said active element and being shorter than $kg/4$, and said second capacitance element being connected to the other end of said second microstrip line and ground, and wherein said DC bias voltage supply circuit has a DC bias supply ($V_{DS}$) for supplying the DC bias voltage to a connecting point between the other end of said second microstrip line and said second capacitance element.

27. An amplifier according to claim 26, wherein said second microstrip line has a length not more than $3\lambda g/16$.

* * * * *